(12) United States Patent
Ritter et al.

(10) Patent No.: US 11,776,809 B2
(45) Date of Patent: Oct. 3, 2023

(54) FABRICATION OF A SEMICONDUCTOR DEVICE

(71) Applicant: International Business Machines Corporation, Armonk, NY (US)

(72) Inventors: Markus Fabian Ritter, Adliswil (CH); Fabrizio Nichele, Zurich (CH); Heinz Schmid, Wädenswil (CH); Heike Erika Riel, Baech (CH)

(73) Assignee: International Business Machines Corporation, Armonk, NY (US)

( * ) Notice: Subject to any disclaimer, the term of this patent is extended or adjusted under 35 U.S.C. 154(b) by 91 days.

(21) Appl. No.: 17/387,625

(22) Filed: Jul. 28, 2021

(65) Prior Publication Data
US 2023/0033374 A1    Feb. 2, 2023

(51) Int. Cl.
*H01L 21/02* (2006.01)
*H01L 29/06* (2006.01)

(52) U.S. Cl.
CPC .... *H01L 21/02603* (2013.01); *H01L 21/0262* (2013.01); *H01L 21/02642* (2013.01); *H01L 21/02645* (2013.01); *H01L 29/0665* (2013.01)

(58) Field of Classification Search
CPC ................................................ H01L 21/02603
See application file for complete search history.

(56) References Cited

U.S. PATENT DOCUMENTS

| | | | |
|---|---|---|---|
| 3,406,049 A | 10/1968 | Marinace | |
| 8,242,540 B2 | 8/2012 | Wann et al. | |
| 8,822,248 B2 | 9/2014 | Park | |
| 10,435,812 B2* | 10/2019 | Han | C30B 25/186 |
| 2007/0072398 A1 | 3/2007 | Shibata et al. | |
| 2007/0105356 A1* | 5/2007 | Wu | H01L 21/28525 438/584 |
| 2016/0351391 A1* | 12/2016 | Borg | H01L 21/02639 |

(Continued)

FOREIGN PATENT DOCUMENTS

| | | |
|---|---|---|
| WO | 2014062002 A1 | 4/2014 |
| WO | 2022/096177 A1 | 5/2022 |

OTHER PUBLICATIONS

International Search Report and Written Opinion received for PCT Application Serial No. PCT/EP2022/063835 dated Sep. 15, 2022, 13 pages.

(Continued)

*Primary Examiner* — Yara B Green
*Assistant Examiner* — Fakeha Sehar
(74) *Attorney, Agent, or Firm* — Amin, Turocy & Watson, LLP (57) ABSTRACT

Embodiments of the invention relate to a method for fabricating a semiconductor structure comprising a semiconductor material, and a semiconductor substrate fabricated from the method. The method can include a step of providing a template structure. The template structure can comprise an opening, a cavity and a seed structure. The seed structure can comprise a seed material and a seed surface. An inner surface of the template structure can comprise at least one metallic surface area comprising a metallic material. The embodied method further comprises a step of growing the semiconductor structure within the cavity of the template structure from the seed surface along the metallic surface area.

16 Claims, 9 Drawing Sheets

105

(56) References Cited

U.S. PATENT DOCUMENTS

2017/0104058 A1  4/2017 Borg et al.
2021/0151320 A1  5/2021 Pushp

OTHER PUBLICATIONS

Ritter et al., "Semiconductor Epitaxy in Superconducting Templates", Nano Letters, vol. 21, Nov. 18, 2021, pp. 9922-9929.

Borg et al., "Mechanisms of template-assisted selective epitaxy of InAs nanowires on Si," Journal of Applied Physics 117, 144303 (2015), [http://dx.doi.org/10.1063/1.4916984], 8 pages.

IBM.com, "III-V integration & devices," Published Online Jan. 13, 2021, https://www.zurich.ibm.com/st/nanodevices/monolithicgrowth.html, 13 pages.

Convertino et al., "InGaAs FinFETs Directly Integrated on Silicon by Selective Growth in Oxide Cavities," Materials 2019, 12, 87; doi: 10.3390/ma12010087, 6 pages.

Brunelli, et al. "Selective and confined epitaxial growth development for novel nano-scale electronic and photonic device structures," J. Appl. Phys. 126, 015703 (2019); https://doi.org/10.1063/1.5097174, 9 pages.

Schmid et al., "Template-assisted selective epitaxy of III-V nanoscale devices for co-planar heterogeneous integration with Si," Applied Physics Letters 106, 233101 (2015); doi: 10.1063/1.4921962, 6 pages.

* cited by examiner

SiO₂ (reference)

TiN & SiO2

Template aspect ratio

FABRICATION OF A SEMICONDUCTOR DEVICE

STATEMENT REGARDING FEDERALLY SPONSORED RESEARCH OR DEVELOPMENT

This invention was made with Government support under 140D6318C0028 awarded by Defense Advanced Research Projects Agency (DARPA). The Government has certain rights in this invention.

BACKGROUND

Embodiments of the invention relate generally to a method for fabricating a semiconductor device. Embodiments of the invention further relate to a device obtainable by such a method.

Nanometer-sized quantum devices as well as advanced meso-scale systems can utilize material combinations and process steps that are beyond the offerings that current Complementary Metal Oxide Semiconductor (CMOS) technology can provide. Improved or entirely new fabrication modules are therefore desired to fill these shortcomings.

Although processes based on selective epitaxy are widely used, they cannot be applied to many relevant structures because of the long process times, large consumption of chemicals and corresponding expenses.

Improving the efficiency of the epitaxy process is therefore highly desirable.

SUMMARY

According to an aspect, an embodiment of the invention is a method for fabricating a semiconductor structure comprising a semiconductor material. The method can comprise a step of providing a template structure. The template structure can comprise an opening, a cavity and a seed structure. The seed structure can comprise a seed material and a seed surface. An inner surface of the template structure can comprise at least one metallic surface area comprising a metallic material. The embodied method further comprises a step of growing the semiconductor structure within the cavity of the template structure from the seed surface along the metallic surface area.

Embodiments of the invention are based on a discovery of the inventors that a metallic surface area inside the template structure can increase the growth rate of the semiconductor structure substantially.

Hence according to embodiments of the invention, cavities with metallic surface areas can be used to locally tune the growth dynamics of the semiconductor structure.

According to embodiments, the integration of the metallic surface on the inner surface of the template structure, i.e., on the surface of the cavity, can be used to increase the process efficiency and economy. It can furthermore be used to increase the growth rate and the growth selectivity. Furthermore, it can be used to grow devices of different shapes and sizes simultaneously.

According to embodiments, the metallic surface area can form a top part, a bottom part and/or a side part of the inner surface of the template structure. The extension and location of the metallic surface area can be adapted in dependence on a respective fabrication process as well as in dependence on the desired semiconductor structure. According to embodiments, a part of the inner surface of the template structure or the whole inner surface of the template structure can be covered with the metallic surface area.

According to an embodiment, the metallic material and the semiconductor material can be selected such that the metallic material does not provide a nucleation site for the semiconductor material.

According to an embodiment, the metallic material has a melting point that is higher than a process temperature at which the step of growing the semiconductor structure is performed. According to an embodiment, the metallic material is chemically stable at the process temperature.

According to an embodiment, the metallic material is a transition metal nitride. Such materials can increase the growth rates.

According to embodiments, the transition metal nitride can be Titanium Nitride (TiN), Zirconium Nitride (ZrN), Hafnium Nitride (HfN), Vanadium Nitride (VN), Niobium Nitride (NbN), Tantalum Nitride (TaN), Molybdenum Nitride (MoN) and/or Tungsten Nitride (WN).

According to embodiments, the semiconductor material can be a group III-V semiconductor material comprising a group III element and a group V element. According to embodiments, the step of growing the semiconductor structure can be performed at a flow rate of less than 150 micromole ($\mu$mol)/minute (min) for the group V element and less than 2 $\mu$mol/min for the group III element.

This is based on a discovery that the growth speed-up by the metallic surface area is particularly high in the case of low material flow growth conditions.

According to embodiments, providing the template structure comprises forming a first template layer from a first template material and forming a second template layer from a second template material, wherein the first template material is the metallic material.

This facilitates an efficient fabrication.

According to embodiments, the metallic material is selected such that it provides a surface energy lower than the surface energy of the seed surface and/or the surface energy of a front surface of the semiconductor structure during the step of growing, but higher than the surface energy of the second template material. This allows semiconductor precursor species to reach the front surface of the semiconductor structure during the growth within the cavity efficiently, but without nucleating on the surface of the first template material. In this respect, the front surface shall be understood as the respective exposed surface of the semiconductor structure during the growth within the cavity.

According to embodiments, the metallic material is selected such that it provides a surface migration length higher than the surface migration length of the surface of the second template material. This allows semiconductor precursor species to reach the front surface of the semiconductor structure during the growth within the cavity efficiently, since precursor species can travel further before desorbing.

The surface migration length shall describe a property of the respective surface with respect to the semiconductor precursor species of the corresponding growth process, e.g., the metal organic chemical vapor deposition (MOCVD). More particularly, the surface migration length shall be understood as the migration length of semiconductor precursor species on the surface of the first template material and the second template material respectively.

According to embodiments, the metallic material is selected such that it provides a surface adsorption rate for the semiconductor material higher than the surface adsorption rate of the surface of the second template material. This can result in the semiconductor precursor species from the growth atmosphere being captured efficiently.

The surface adsorption rate shall describe a property of the respective surface with respect to the semiconductor precursor species of the corresponding growth process, e.g., the MOCVD. The surface adsorption rate shall be understood as the adsorption rate of precursor species on the surface of the first template material and the second template material respectively.

According to an embodiment of a further aspect of the invention, a semiconductor device obtainable by a method according to the previous aspect is provided.

A further aspect of an embodiment of the invention relates to the use of a metallic surface area within a template structure for increasing the growth rate of a semiconductor structure during an epitaxial growth within a cavity of the template structure.

A further aspect of an embodiment of the invention relates to the use of a metallic surface area within a template structure to increase the ratio of group-V to group-III precursor material species at a front surface of a semiconductor structure during an epitaxial growth within a cavity of the template structure. This is based on a discovery that the use of a metallic surface area within the template structure can allow increase of the V/III semiconductor material ratio inside the cavity during the epitaxial growth.

The steps of the method can be performed in different orders as appropriate. Furthermore, the steps can also be combined as appropriate, i.e., that e.g., two or more steps can be performed together.

Advantages of the features of one aspect of the invention can apply to corresponding features of another aspect of the invention.

Embodiments of the invention will be described in more detail below, by way of illustrative and non-limiting examples, with reference to the accompanying drawings.

DETAILED DESCRIPTION

At first, in reference to FIGS. 1-5, some general aspects and terms of embodiments of the invention are described.

In any or all of the figures the dimensions may not be drawn to scale and can be shown in a simplified and schematic way to illustrate the features and principles of embodiments of the invention.

The term "on" and "above" are used in this context, as is customary, to indicate orientation or relative position in a vertical or orthogonal direction to the surface of the substrate, in particular in a vertical z-direction.

The terms "lateral" or "laterally" are used in this context, as is customary, to indicate orientation generally parallel to the plane of the substrate, as opposed to generally vertically, or outwardly, from the substrate surface.

The term "arranged on a/the semiconductor substrate" shall be understood in a broad sense and shall include in particular embodiments according to which an intermediate layer, e.g., an insulating layer, is arranged between the substrate and the crystal structure. Hence the term "arranged on the substrate" shall include the meaning arranged "above the substrate".

Methods according to embodiments of the invention allow fabrication of semiconductor structures by epitaxial growth in a highly efficient manner.

FIGS. 1a-1f show enlarged 3-dimensional views of initial, intermediate and prefinal or final structures formed during the stages of fabrication methods according to embodiments of the invention.

Figure 1A:
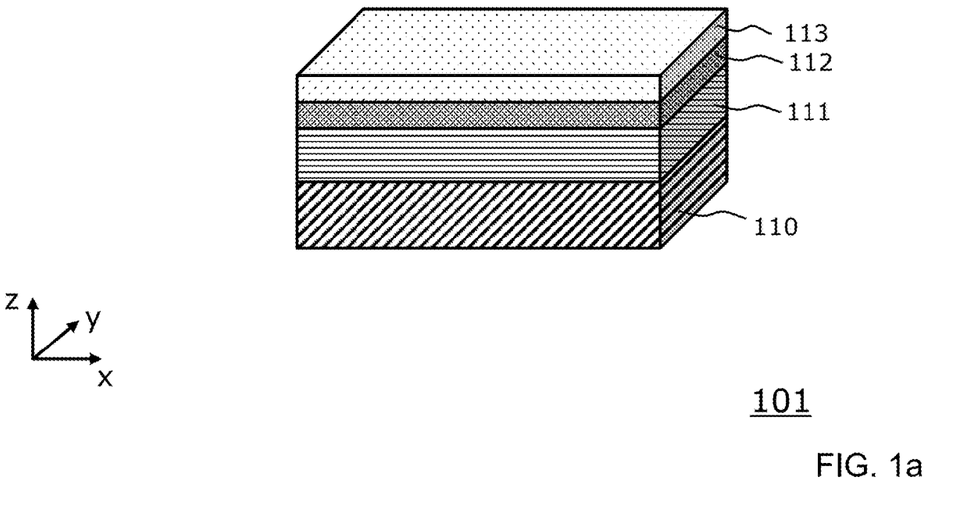
FIG. 1a shows a 3-dimensional view of an initial structure.

FIG. 1a shows a 3-dimensional view of an initial structure 101.

The initial structure 101 comprises a substrate 110. The substrate 110 can comprise a semiconductor material and can be e.g., a bulk semiconductor substrate. The substrate 110 can be embodied as a crystalline semiconductor or a compound semiconductor wafer of a large diameter. The substrate can comprise, for example, a material from group IV of the periodic table as semiconductor material. Materials of group IV include, for example, silicon, germanium, mixed silicon and germanium, mixed silicon and carbon, mixed silicon germanium and carbon and the like. For example, the substrate 110 can be a crystalline silicon wafer that is used in the semiconductor industry. For the following description, it is assumed that the substrate comprises silicon (Si), which is illustrated by diagonal stripes.

The structure 101 can also comprise an insulating layer 111 on the substrate 110. The insulating layer 111 can be embodied as a dielectric layer. The insulating layer 111 can be formed by known methods, as for example, thermal oxidation, chemical vapor deposition (CVD), plasma enhanced CVD (PECVD), atomic layer deposition, chemical solution deposition, MOCVD, evaporation, sputtering and/or other deposition processes. Examples of such dielectric material include, but are not limited to: Silicon Dioxide (SiO2), Silicon Nitride (Si3N4), Aluminum Oxide (Al2O3), Aluminium Oxynitride (AlON), Tantalum Pentoxide (Ta2O5), Titanium Dioxide (TiO2), Lanthanum Oxide (La2O3), Strontium Titanate (SrTiO3), Lanthanum Aluminate (LaAlO3), Zirconium Dioxide (ZrO2), Yttrium Oxide (Y2O3), Gadolinium Oxide (Gd2O3), Magnesium Oxide (MgO), Hafnium (Hf)-based materials and combinations including multilayers thereof.

For the following exemplary description, it is assumed that the insulating layer 111 comprises SiO2, which is illustrated by horizontal stripes.

The structure 101 further comprises a sacrificial layer 112 on the insulating layer 111. The sacrificial layer 112 can comprise or consist of a seed material. The seed material can be a group-IV material. The seed material can be, in particular, Si. According to embodiments, the substrate 110, the insulating layer 111 and the sacrificial layer 112 can be embodied as a silicon-on-insulator (SOI) wafer. According to other embodiments the seed material can be a group III-V material, e.g., Gallium Arsenide (GaAs), Indium Arsenide (InAs) or Indium Phosphide (InP).

The structure 101 further comprises a first template layer 113. The first template layer 113 can comprise a first template material. The first template material can be a metallic material, in particular, a transition metal nitride. The first template material can be embodied as TiN, ZrN, HfN, VN, NbN, TaN, MoN or WN. According to an embodiment, the first template layer 113 can be a 25 nanometer (nm) thick film of TiN. The sacrificial layer 112 is illustrated by a dotted pattern of 30% and the first template layer 113 by a dotted pattern of 5%.

The thicknesses of the substrate 110, the insulating layer 111, the sacrificial layer 112 and the first template layer 113 can be any suitable thicknesses.

Figure 1B:
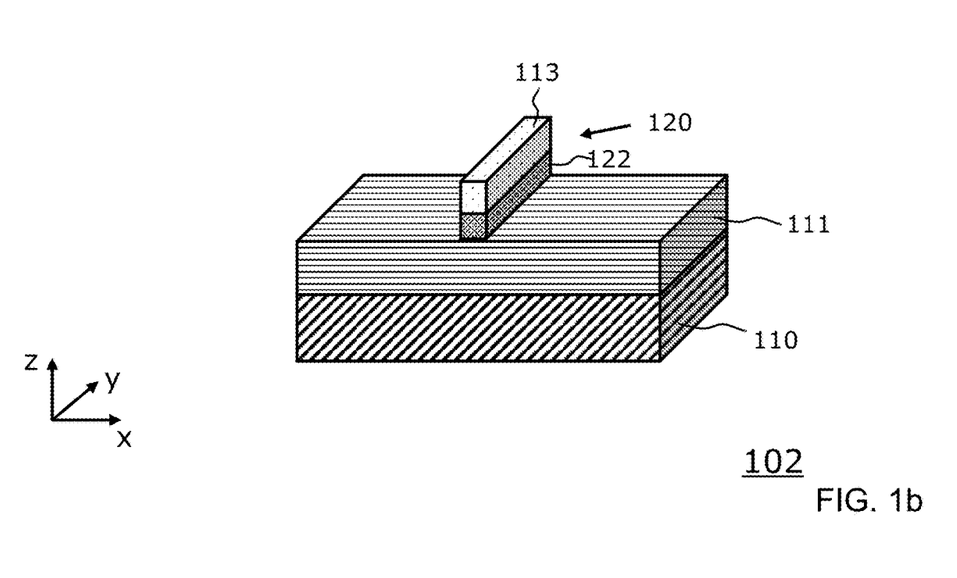
FIG. 1B illustrates a 3-dimensional view of a structure comprising a nanowire which has been formed from the structure of FIG. 1a by patterning.

FIG. 1B illustrates a 3-dimensional view of a structure 102. The structure 102 has been formed from the structure 101 by patterning the sacrificial layer 112 and the first template layer 113. The patterned sacrificial layer 112 and the patterned first template layer 113 form a nanowire 120. The patterning of the sacrificial layer 112 and the first template layer 113 can be performed by one or more lithography and etching steps. The etching can be based in particular on Hydrogen bromide (HBr) chemistry. This is a well know technique and used as standard technique in Si photonics. It can provide smooth sidewalls.

The patterned sacrificial layer 112 forms a sacrificial structure 122. The sacrificial structure 122 forms the inner part of a template structure to be formed subsequently and can be replaced locally by another semiconductor material, in particular, a group III-V semiconductor material.

Figure 1C:
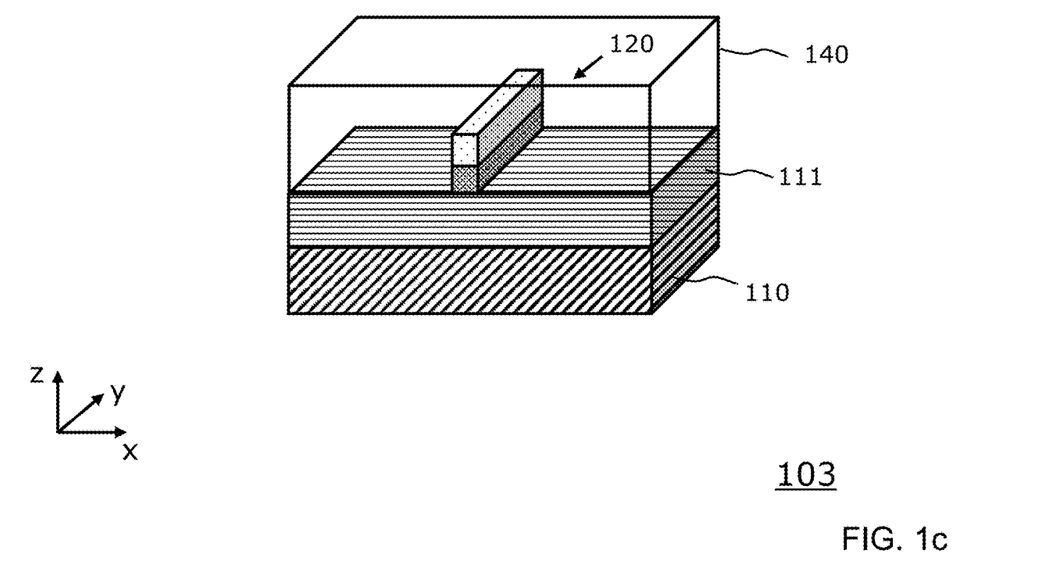
FIG. 1c illustrates a 3-dimensional view of a structure which has been formed from the structure of FIG. 1B by encapsulating the nanowire in a template structure.

FIG. 1c illustrates a 3-dimensional view of a structure 103. The structure 103 has been formed from the structure 102 by encapsulating the nanowire 120. More particularly, the nanowire 120 can be covered with a second template layer 140 of a dielectric material. In the embodiment of FIG. 1c, it is assumed that the second template layer 140 comprises or consists of SiO2. The second template layer 140 is illustrated in a transparent manner to facilitate the illustration of aspects of the invention.

Figure 1D:
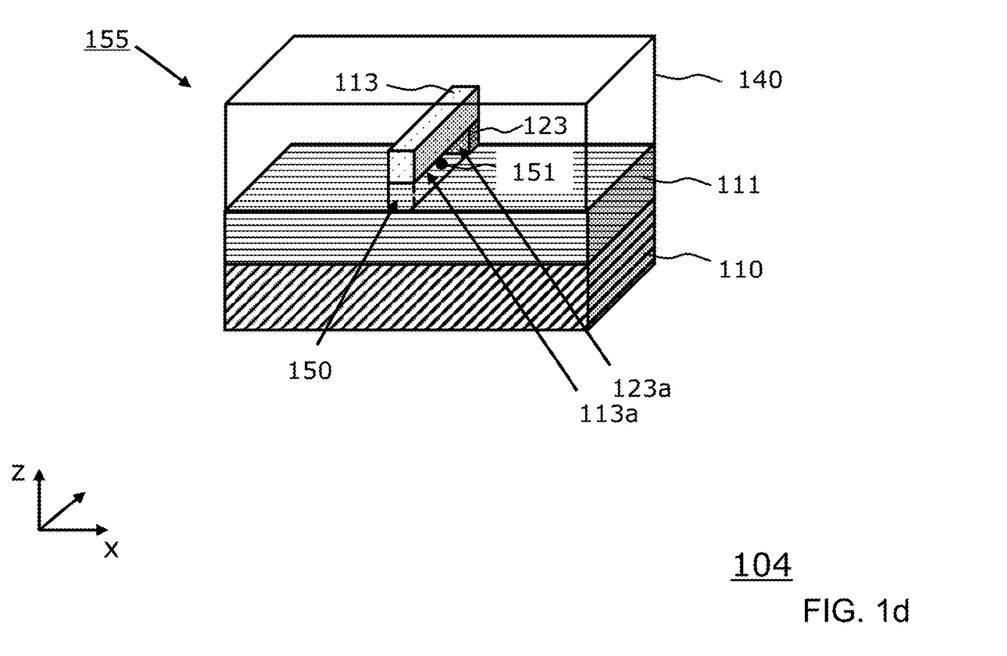
FIG. 1d illustrates a 3-dimensional view of a structure which has been formed from the structure of FIG. 1c by forming an opening and a cavity within the template structure.

FIG. 1d illustrates a 3-dimensional view of a structure 104. The structure 104 has been formed from the structure 103 by forming an opening 150 in the second template layer 140. More particularly, the SiO2 of the second template layer 140 has been etched, e.g., by reactive-ion etching (RIE), to give access to the sacrificial Si material of the sacrificial structure 122. In addition, a selective removal of a part of the seed material of the sacrificial structure 122 back to a desired remaining portion of a seed structure 123 has been performed. The seed structure 123 provides a seed surface 123a. The selective removal has formed a hollow cavity 151 of a template structure 155 for a subsequent growth step. The selective removal can be performed, in particular, by a selective etching technique. The template structure 155 can comprise the opening 150, the cavity 151, the seed structure 123 with the seed surface 123a, the first template layer 113 and the second template layer 140. The first template layer 113 can form a top part of the inner surface of the template structure 155, while the side walls of the inner surface can be formed by the second template layer 140 and the bottom of the inner surface can be formed by the insulating layer 111. More particularly, the first template layer 113 can provide an inner surface 113a towards the cavity 151 and hence can provide a metallic surface area 113a of the inner surface of the template structure 155. In other words, the metallic surface area 113a, which is provided by first template layer 113, can form a top part or ceiling of the inner surface of the template structure 155 or, in other words, a top part or ceiling of the cavity 151.

According to other embodiments and other fabrication methods, the template structure 155 can also comprise metallic surface areas as side part/side walls or as bottom parts of the inner surface of the template structure. This can be achieved by deposition of the first template material before the deposition of the sacrificial structure, i.e., e.g., by providing a first template layer directly on the insulating layer 111. According to other embodiments the first template layer comprising the metallic material can be deposited after the deposition of the second template layer, e.g., by local etching of the second template layer.

According to further embodiments, a combination of such techniques and methods can be performed.

According to the embodiments as described above with reference to FIGS. 1a-1d, the first template layer 113 comprising the first template material has been fabricated in a self-aligned manner with respect to the sacrificial structure 122 and the seed structure 123.

Figure 1E:
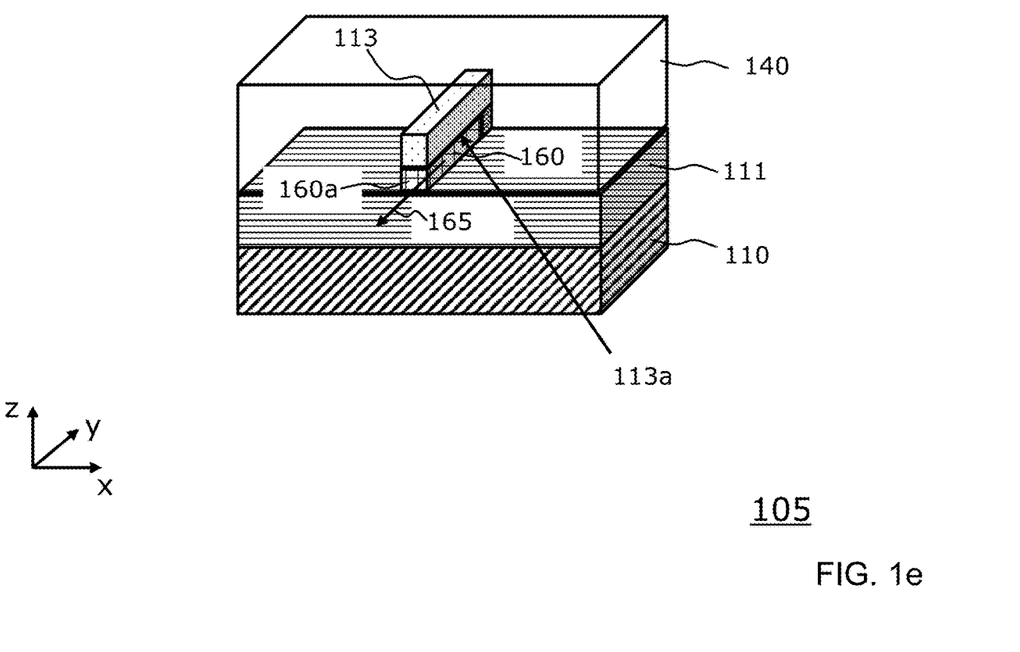
FIG. 1e illustrates a 3-dimensional view of a structure which has been formed from the structure of FIG. 1d by growing within the template structure a semiconductor structure.

FIG. 1e illustrates a 3-dimensional view of a structure 105. The structure 105 has been formed from the structure 104 by growing within the template structure 155, more particularly within the cavity 151, a semiconductor structure 160 from the seed surface 123a. The growth of the semiconductor structure 160 comprises a nucleation phase and a growth phase of the semiconductor structure 160. The growth is performed in a growth direction 165 in parallel to the semiconductor substrate 110 and hence in a lateral direction. The growth is furthermore performed along the metallic surface area 113a of the cavity 151. The presence of the metallic surface area 113a can facilitate and increase the growth rate of the semiconductor 160 compared with a growth rate in a pure dielectric cavity, i.e., within a template structure which has only dielectric inner surface areas. The semiconductor structure 160 is illustrated by a grid pattern. An exposed surface 160a of the semiconductor structure 160 establishes a front surface 160a during the growth of the semiconductor structure 160.

The semiconductor structure 160 can comprise, in particular, a group III-V semiconductor material.

The growing of the semiconductor structure 160 can be performed e.g., by MOCVD, by atmospheric pressure CVD, by low or reduced pressure CVD, by ultra-high vacuum CVD, by molecular beam epitaxy (MBE), by atomic layer deposition (ALD) or by hydride vapor phase epitaxy.

According to embodiments, the metallic material of the first template layer 113 and the semiconductor material of the semiconductor structure 160 are selected such that the metallic material does not provide a nucleation site for the semiconductor material. This facilitates an efficient growth within the cavity 151. Furthermore, the metallic material can have a melting point that is higher than the process temperature at which growing of the semiconductor structure 160 is performed. In addition, the metallic material can be chosen to be a material that is stable at the process temperature.

Figure 1F:
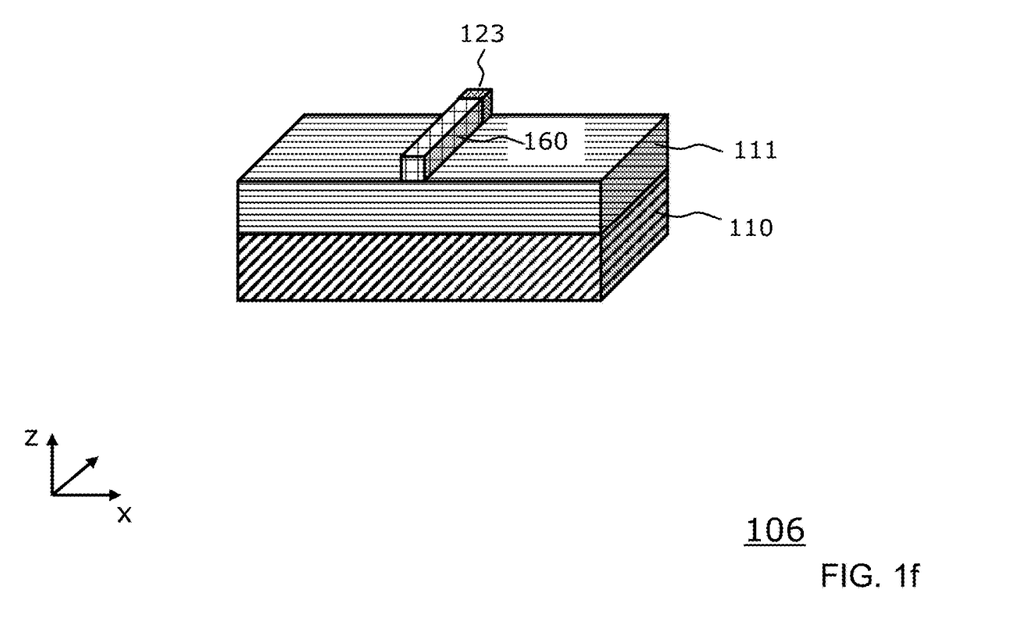
FIG. 1f illustrates a structure which has been formed from the structure of FIG. 1e by removing the template structure.

FIG. 1f illustrates a 3-dimensional view of a structure 106. The structure 106 has been formed from the structure 105 by removing the second template layer 140 and the first template layer 113, e.g., by suitable etching techniques. This has released the semiconductor structure 160.

The semiconductor structure 160 can then be further processed in view of the envisaged application of the final device, e.g., by providing electrical contacts.

FIGS. 2a-2g show enlarged 3-dimensional views of initial, intermediate and prefinal or final structures formed during the stages of fabrication methods according to another embodiment of the invention.

Figure 2A:
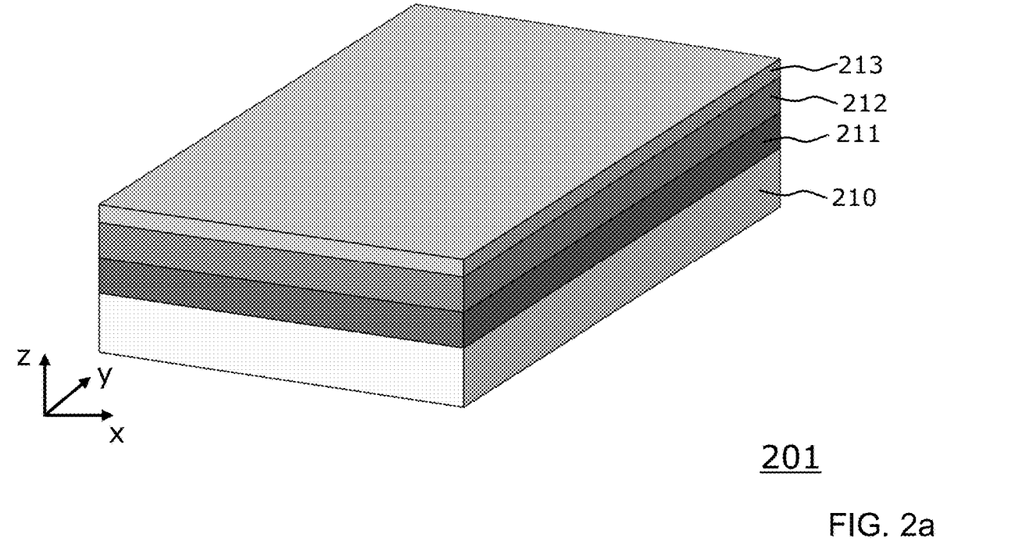
FIG. 2a shows a 3-dimensional view of an initial structure.

FIG. 2a shows a 3-dimensional view of an initial structure 201.

The initial structure 201 comprises a substrate 210. The substrate 210 can comprise a semiconductor material and can be e.g., a bulk semiconductor substrate. The substrate 210 can be embodied as a crystalline semiconductor or a compound semiconductor wafer of a large diameter and can be generally embodied as the substrate 110 as described with reference to FIG. 1a.

The structure 201 further comprises an insulating layer 211 on the substrate 210. The insulating layer 211 can be embodied e.g., as a dielectric layer as described with reference to FIG. 1a. The insulating layer 211 is illustrated by a grey shading.

The structure 201 further comprises a sacrificial layer 212 on the insulating layer 211. The sacrificial layer 212 can comprise or consist of a seed material as described with reference to FIG. 1a. The structure 201 can further comprise a first template layer 213. The first template layer 213 can comprise as first template material, a metallic material, in particular, a transition metal nitride. The sacrificial layer 212 is also illustrated by a grey shading, but with a lighter grey than the dielectric layer 211. The first template layer 213 is also illustrated by a grey shading, but with a lighter grey than the sacrificial layer 212.

The substrate 210, the insulating layer 211 and the sacrificial layer 212 can be in particular, embodied as a silicon-on-insulator (SOI) wafer.

According to embodiments, the SOI layer 210-212 can be metallized by sputtering a 25 nm thick layer of TiN, thereby forming the layer 213 of TiN as the first template layer.

Figure 2B:
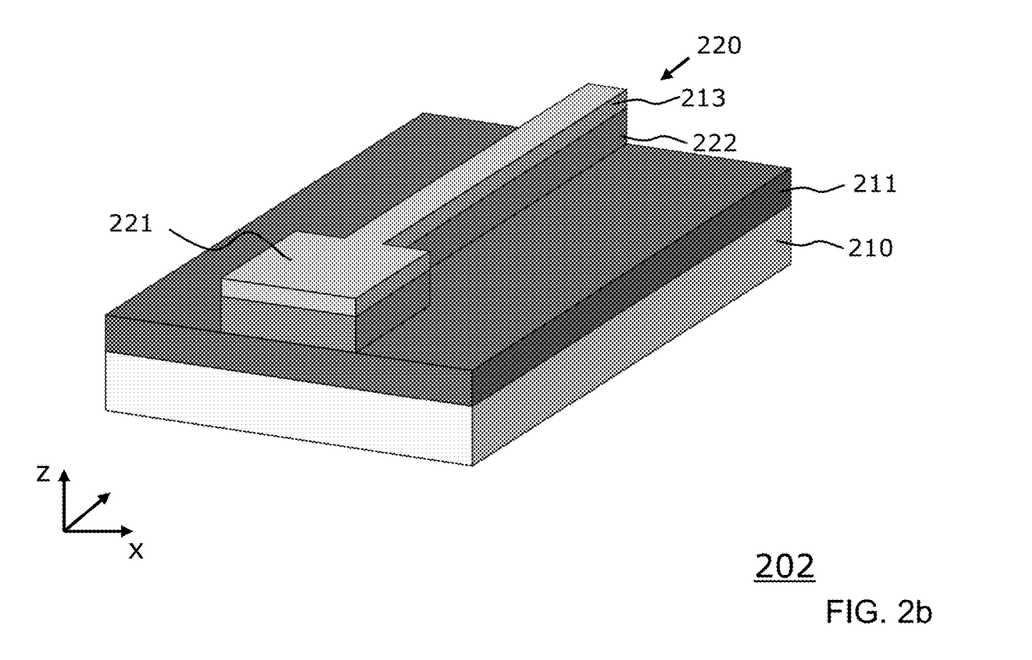
FIG. 2b illustrates a 3-dimensional view of a structure comprising a nanowire which has been formed from the structure of FIG. 2a by patterning.

FIG. 2b illustrates a 3-dimensional view of a structure 202. The structure 202 has been formed from the structure 201 by patterning the sacrificial layer 212 and the first template layer 213. The patterned sacrificial layer 212 and the patterned first template layer 213 form a nanowire 220 which terminates in a square 221. The patterning of the sacrificial layer 212 and the first template layer 213 can be performed by one or more lithography and etching steps, in particular by dry etching.

The patterned sacrificial layer 212 forms a sacrificial structure 222. The sacrificial structure 222 forms the inner part of a template structure to be formed subsequently and can be replaced locally by another semiconductor material, in particular, a group III-V semiconductor material.

Figure 2C:
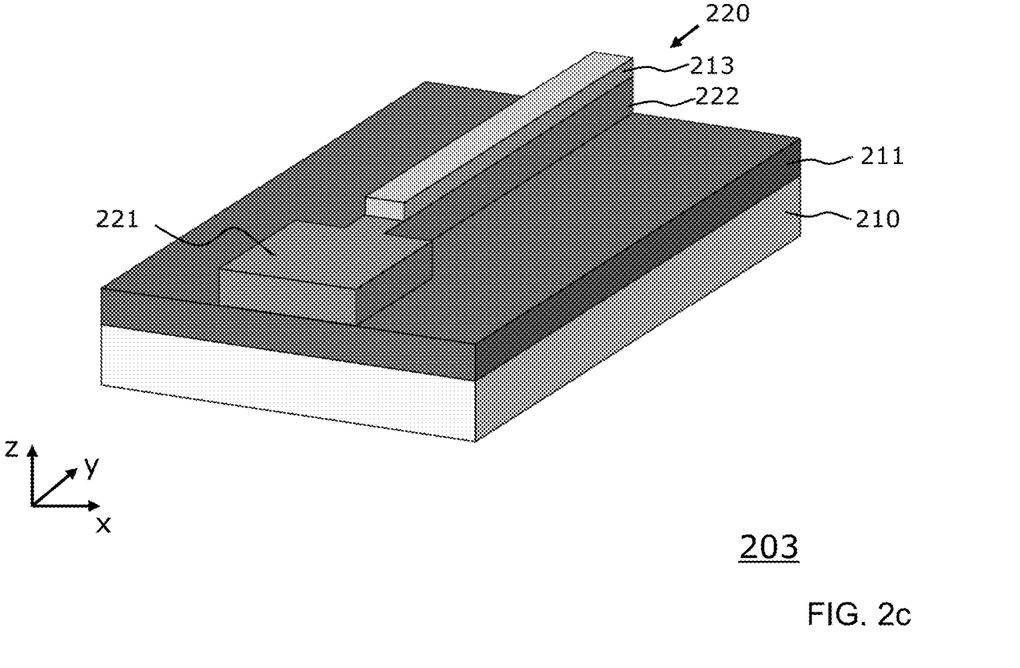
FIG. 2c illustrates a 3-dimensional view of a structure which has been formed from the structure of FIG. 2b by further patterning a part of the nanowire.

FIG. 2c illustrates a 3-dimensional view of a structure 203. The structure 203 has been formed from the structure 202 by further patterning the first template layer 213. More particularly, the first template layer 213 has been removed within the square 221, e.g., by etching, e.g., by local wet etching from one end of the nanowire 220, which leaves the underlying SOI unaffected.

Figure 2D:
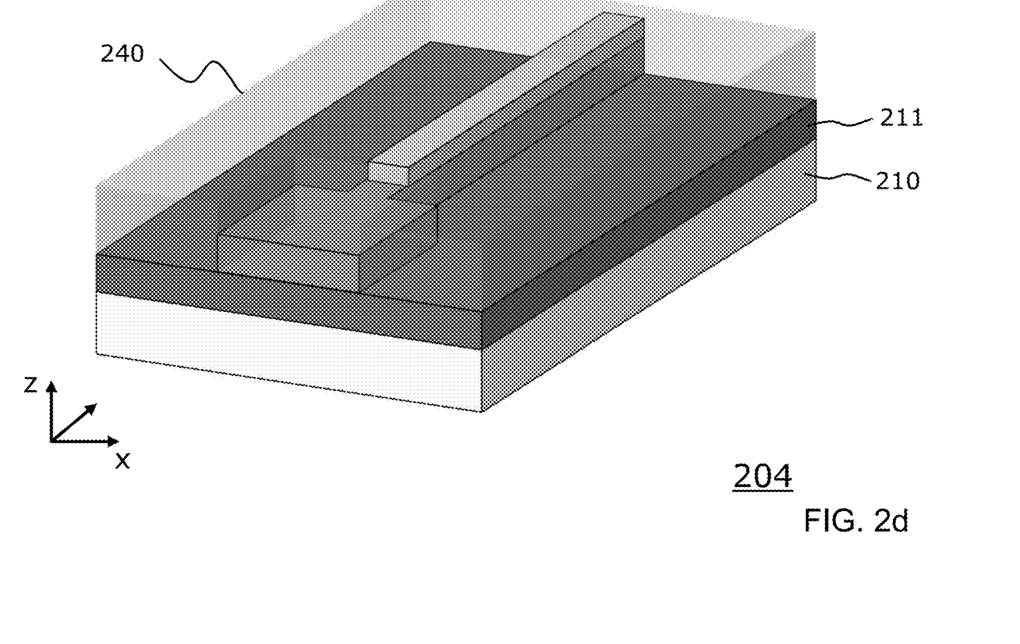
FIG. 2d illustrates a 3-dimensional view of a structure which has been formed from the structure of FIG. 2c by encapsulating the nanowire in a template structure and by forming an opening.

FIG. 2d illustrates a 3-dimensional view of a structure 204. The structure 204 has been formed from the structure 203 by encapsulating the sacrificial structure 222 and the first template layer 213. More particularly, the sacrificial structure 222 and the first template layer 213 can be covered with a second template layer 240 of a dielectric material. This can be performed e.g., by covering the sacrificial structure 222 and the first template layer 213 by conformal deposition of a 40 nm thick SiO2 layer. The second template layer 240 is illustrated in a transparent manner with a light grey shading.

Figure 2E:
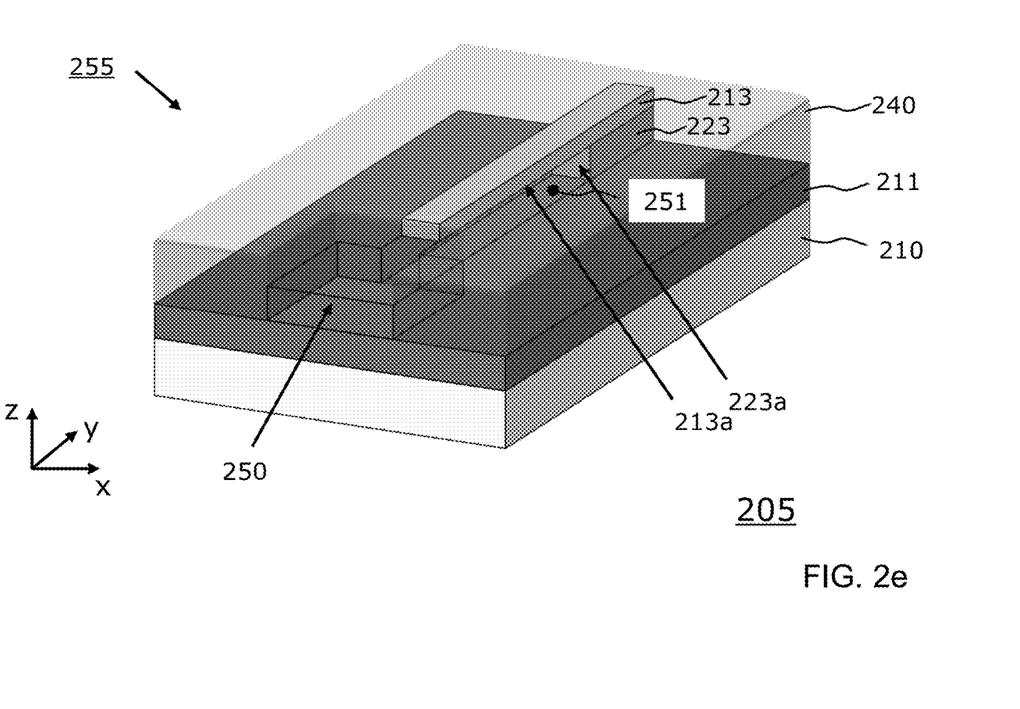
FIG. 2e illustrates a 3-dimensional view of a structure which been formed from the structure of FIG. 2d by forming a cavity within the template structure.

FIG. 2e illustrates a 3-dimensional view of a structure 205. The structure 205 has been formed from the structure 204 by forming an opening 250 to the sacrificial structure 222 in the second template layer 240. More particularly, the SiO2 of the second template layer 240 has been etched, e.g., by RIE, to give access to the sacrificial Si material. In addition, a selective removal of the seed material of the sacrificial structure 222, in particular, the Si, back to a desired position of a seed surface 223a of a remaining seed structure 223 has been performed. This has formed a hollow cavity 251 of template structure 255 for a subsequent growth step. The selective removal can be performed in particular by a selective etching technique. The template structure 255 comprises the opening 250, the cavity 251 and the seed structure 223 with the seed surface 223a. The first template layer 213 provides an inner surface 213a towards the cavity 251 as metallic surface area 213a. In other words, the metallic surface area 213a, which is provided by the first template layer 213, forms a top part or ceiling of the inner surface of the template structure 255.

Figure 2F:
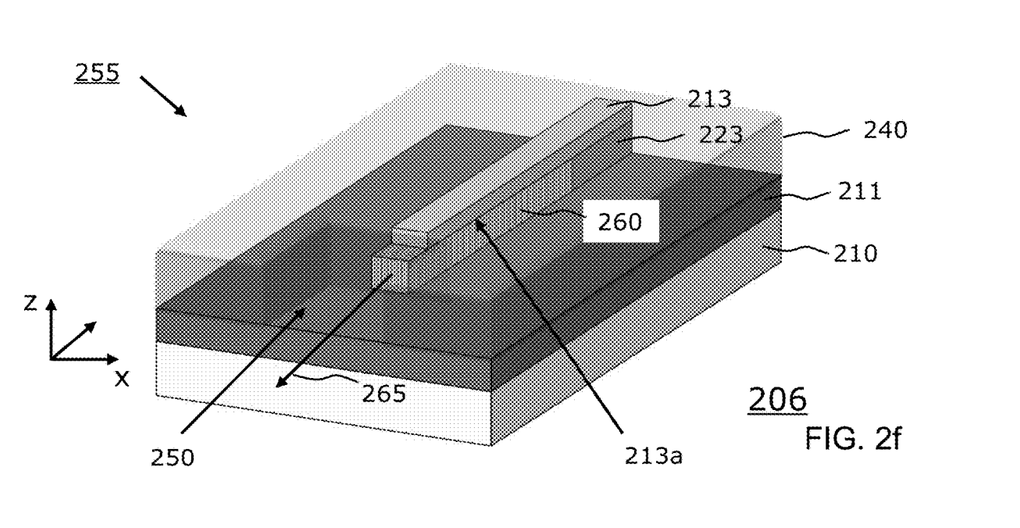
FIG. 2f illustrates a 3-dimensional view of a structure which has been formed from the structure of FIG. 2e by growing within the template structure a semiconductor structure.

FIG. 2f illustrates a 3-dimensional view of a structure 206. The structure 206 has been formed from the structure 205 by growing within the template structure 255, more particularly, within the cavity 251, a semiconductor structure 260 from the seed surface 223a. The growth of the semiconductor structure 260 comprises a nucleation phase and a growth phase of the semiconductor structure 260. The growth can be performed in a growth direction 265 in parallel, or substantially in parallel, to the semiconductor substrate 210 and hence in a lateral direction.

The growth can be furthermore performed along the metallic surface area 213a of the cavity 251. The metallic surface area 213a can facilitate and increase the growth rate of the semiconductor 260 compared with a growth in a pure dielectric cavity. The semiconductor structure 260 is illustrated by a vertical pattern.

The growing of the semiconductor structure 260 can be performed again e.g., by MOCVD, by atmospheric pressure CVD, by low or reduced pressure CVD, by ultra-high vacuum CVD, by molecular beam epitaxy (MBE), by atomic layer deposition (ALD) or by hydride vapor phase epitaxy.

More particularly, according to some embodiments, Indium Arsenide (InAs) nanowires can be grown inside the template structure via metal-organic chemical vapor phase epitaxy (MOVPE) using trimethylindium (TMIn) and tert-butylarsine (TBAs) as precursor species. A high V/III precursor ratio of 150 and a nominal growth temperature of 550 degrees Celsius (° C.) can be used to ensure that nanowires radially fill the template cavities. Height and width of the resulting InAs nanowires can be determined by the SOI layer thickness (e.g., 40 to 70 nm) and template width (e.g., 40 to 100 nm), respectively.

Figure 2G:
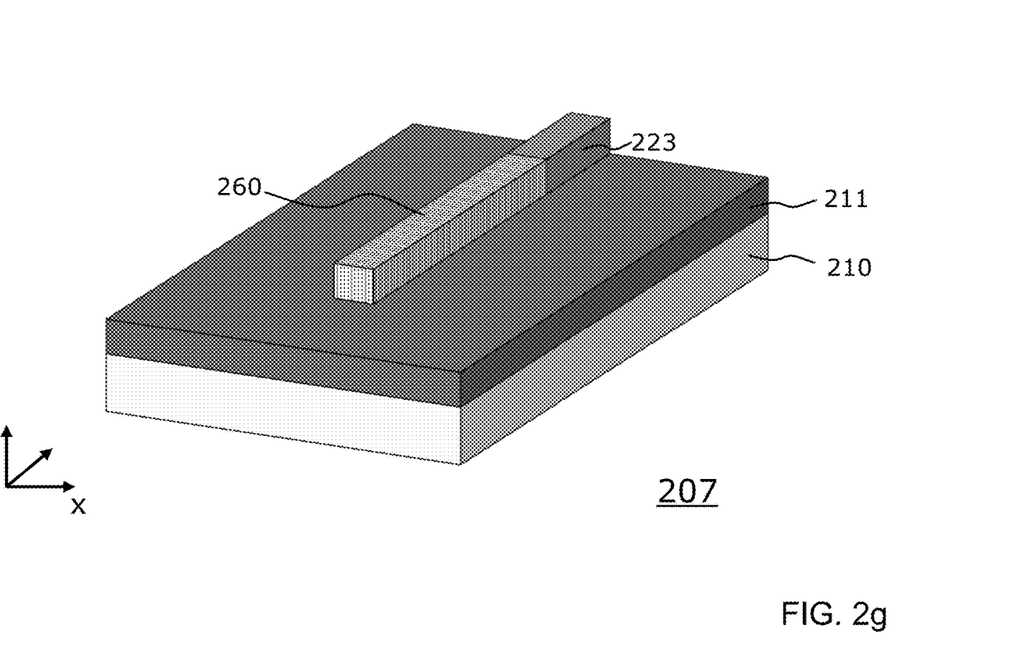
FIG. 2g illustrates a structure which has been formed from the structure of FIG. 2f by removing the template structure.

FIG. 2g illustrates a 3-dimensional view of a structure 207. The structure 207 has been formed from the structure 206 by removing the second template layer 240 and the first template layer 213, e.g., by suitable etching techniques. This has released the semiconductor structure 260. The semiconductor structure 260 can then be further processed in view of the envisaged application of the final device, e.g., by providing electrical contacts.

Figure 3A:
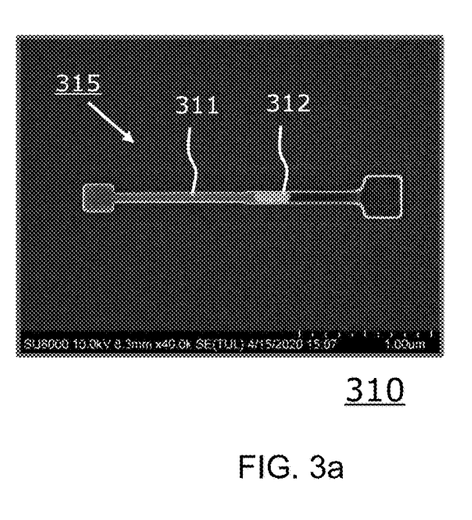
FIG. 3a shows a semiconductor structure which has been grown in a pure dielectric template structure.
Figure 3B:
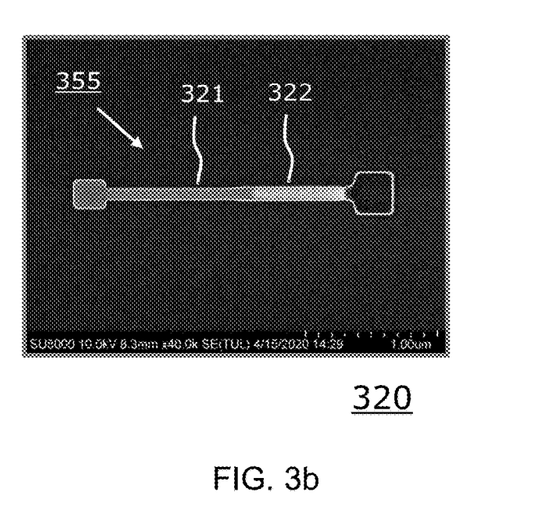
FIG. 3b shows a semiconductor structure which has been grown in a template structure comprising a metallic surface area.

FIG. 3a and FIG. 3b show scanning electron microscope (SEM) images of a nanowire structures which have been formed by an epitaxial growth within a template structure. Both structures have been grown with the same process conditions and the same chemical consumptions, but within different template structures.

More particularly, FIG. 3a shows a semiconductor structure 310 which has been grown in a pure dielectric template structure 315, more particularly, in a template structure with an inner surface that, in this embodiment, consists of SiO2 only. Hence the ceiling, the side walls and the bottom of the cavity of the template structure 315 can, in this embodiment, consist of dielectric surfaces only. The semiconductor structure 310 comprises a nanowire 312 of InAs which has been grown from a Si-seed 311.

On the other hand, FIG. 3b shows a semiconductor structure 320 which has been grown in a template structure 355 which corresponds to the template structure 255 as shown in FIG. 2e, i.e., in a template structure which comprises a metallic surface area 213a as inner surface which consists of TiN. More particularly, the top part/ceiling of the cavity 251 comprises a metallic surface of TiN. The semiconductor structure 320 comprises a nanowire 322 of InAs which has been grown from a Si-seed 321.

Despite the same process conditions, the InAs nanowire 322 is 3 times longer than the InAs nanowire 312. More particularly, the nanowire 312 has a length of approximately 250 nm, while the nanowire 322 has a length of approximately 700 nm. Accordingly, it can be derived that the metallic surface area 213a of the cavity 251 has resulted in a nearly 3 fold increase of the semiconductor growth rate with the new method according to embodiments of the invention.

Figure 4:
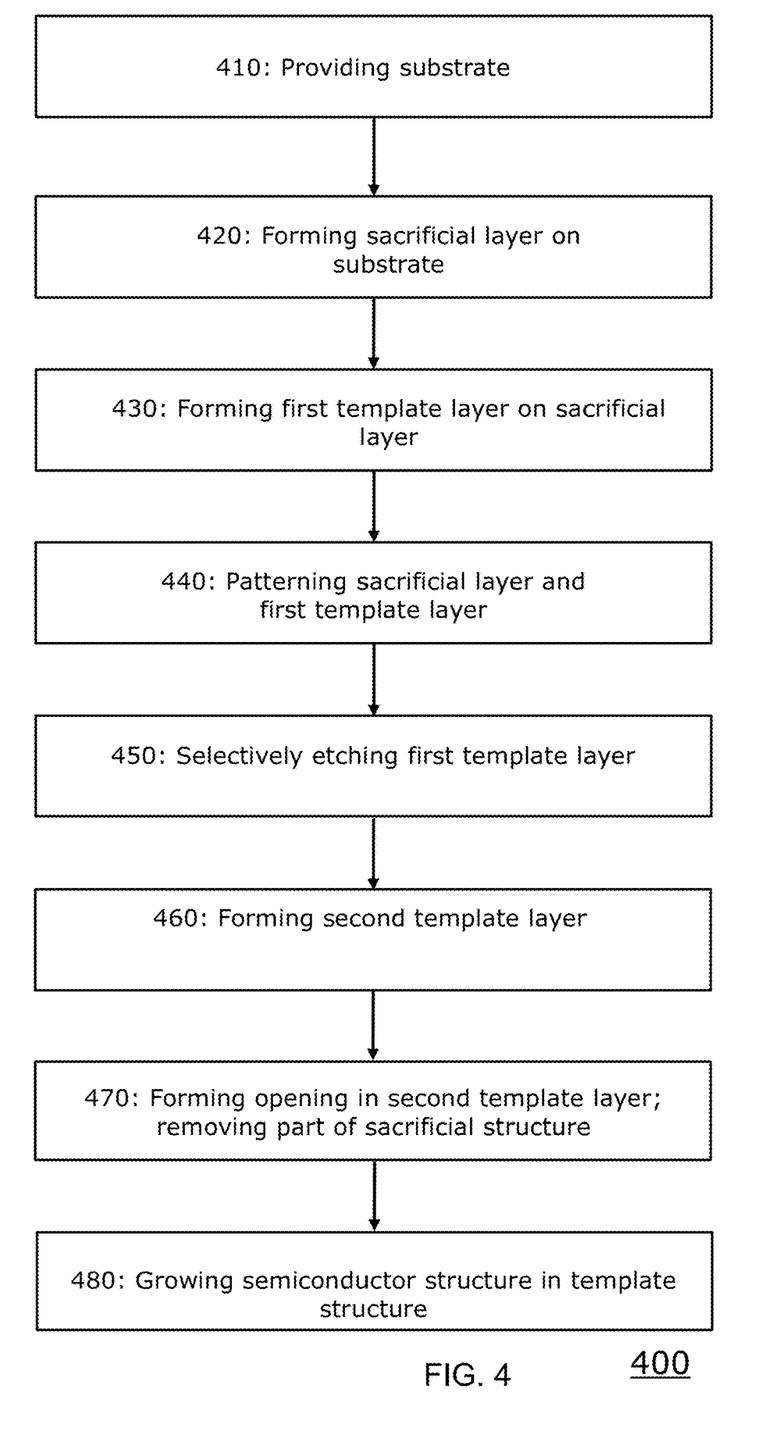
FIG. 4 shows a flow chart of method steps of a method for fabricating a semiconductor structure according to embodiments of the invention.

FIG. 4 shows a flow chart of steps of a method for fabricating a semiconductor structure according to embodiments of the invention, e.g., the semiconductor structure 260 as described with reference to the FIGS. 2a-2g.

At a step 410, a semiconductor substrate or wafer can be provided.

At a step 420, a sacrificial layer can be formed on the substrate, e.g., the sacrificial layer 212.

At a step 430, a first template layer of a metallic material can be formed on the sacrificial layer, e.g., the first template layer 213.

At a step 440, the sacrificial layer and the first template layer can be patterned, as shown e.g., in FIG. 2b.

At a step 450, the first template layer is partly and selectively etched, as shown e.g., in FIG. 2c.

At a step 460, a second template of a dielectric material can be formed on or above the first template layer and the substrate, as shown e.g., in FIG. 2d.

At a step 470, an opening can be formed in the second template layer. Furthermore, a part of the sacrificial structure can be removed, e.g., by a selective etch. This has formed a template structure comprising a cavity as shown in FIG. 2e. A remaining part of the sacrificial structure forms a seed structure for a subsequent growth of a semiconductor structure within the cavity of the template structure.

At a step 480, the semiconductor structure can be grown within the cavity from a seed surface of the seed structure as shown in FIG. 2f. The first template layer comprising the metallic material can establish an inner surface of the template structure and facilitate the growth of the semiconductor structure.

It should be noted that the step 470 can be followed by further processing steps as appropriate to derive a final device structure as desired. This may include, in particular, a step of growing contact layers for contacting the semiconductor structure.

According to embodiments, between step 420 and step 430 there can be a further step of providing an insulating layer, in particular, a layer of SiO2, on the sacrificial layer. According to an example, this could be a thin layer of SiO2 of less than 2 nm. According to embodiments, such a layer can be fabricated by placing an SOI-wafer in Oxygen (O2) plasma before deposition of the first template material in step 430. According to embodiments, such an additional layer could be made from any dielectric material.

Hence, according to such an embodiment, there can be an additional dielectric layer between the sacrificial layer and the first template layer. Such an embodiment can improve the reliability of the subsequent etching step of the sacrificial layer (see step 470).

According to such an embodiment, this thin additional layer can then be removed at a further step, e.g., by etching, between the steps 470 and 480, i.e., just before the epitaxial growth. According to embodiments the thin additional layer can be etched in hydrofluoric acid.

Such an additional layer can also help to keep the metallic surface area pristine and protected during fabrication.

FIGS. 5a to 5d show scanning electron microscope (SEM) images of nanowire structures which have been formed by an epitaxial growth within a template structure. All structures have been grown with the same process conditions and the same chemical consumptions, but within different template structures. The investigations with respect to FIGS. 5a to 5d were performed in order to compare the influence of the aspect ratio of the template structure vs. the influence of the metallic surface area of the inner surface of the template structure. All devices/structures which are shown in FIGS. 5a to 5d are on the same chip.

Figure 5A:
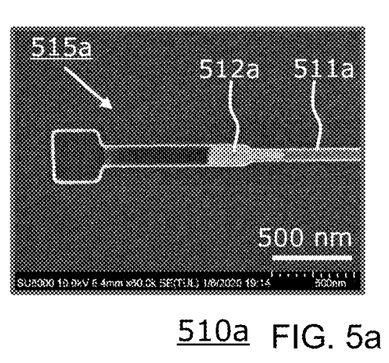
FIG. 5a shows a semiconductor structures which has been grown in a pure dielectric template structure with a low template aspect ratio.

More particularly, FIG. 5a shows a semiconductor structure 510a which has been grown in a pure dielectric template structure 515a, more particularly in a template structure with an inner surface that consists of SiO2 only. The template structure 515a has a first (low) template aspect ratio. The semiconductor structure 510a comprises a nanowire 512a of InAs which has been grown from a Si-seed 511a. The nanowire 512a has a length of app. 470 nm which has been grown in 850 s.

Figure 5B:
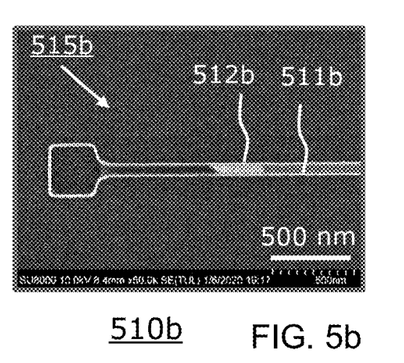
FIG. 5b shows a semiconductor structures which has been grown in a pure dielectric template structure with a high aspect ratio.

FIG. 5b shows a semiconductor structure 510b which has been grown in a pure dielectric template structure 515b, more particularly, in a template structure with an inner surface that, in this embodiment, consists of SiO2 only. The template structure 515b has a second template aspect ratio which is higher than the template aspect ratio of the template structure 515a. The semiconductor structure 510b comprises a nanowire 512b of InAs which has been grown from a Si-seed 511b. The nanowire 512b has a length of app. 300 nm which has been grown in 850 s.

Figure 5C:
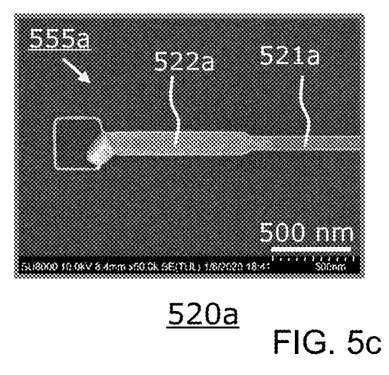
FIG. 5c shows a semiconductor structure which has been grown in a template structure with a low template aspect ratio comprising a metallic surface area.

FIG. 5c shows a semiconductor structure 520a which has been grown in a grown in a template structure 555a which corresponds to the template structure 255 as shown in FIG. 2e, i.e., in a template structure which comprises a metallic surface area 213a as inner surface which consists of TiN. The template structure 555a has the same (first) aspect ratio as the template structure 515a of FIG. 5a. The semiconductor structure 520a comprises a nanowire 522a of InAs which has been grown from a Si-seed 521a. The nanowire 522a has a length of more than 1050 nm which has been grown in 850 s.

Figure 5D:
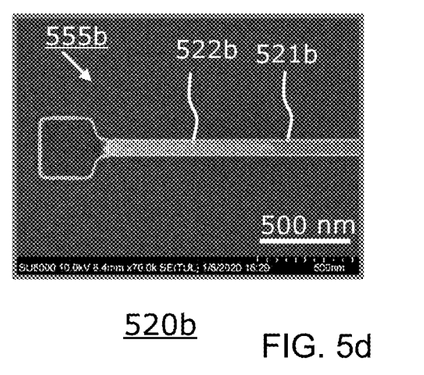
FIG. 5d shows a semiconductor structure which has been grown in a template structure with a high template aspect ratio comprising a metallic surface area.

FIG. 5d shows a semiconductor structure 520b which has been grown in a template structure 555b which corresponds to the template structure 255 as shown in FIG. 2e, i.e., also a template structure which comprises a metallic surface area 213a as inner surface which consists of TiN. The template structure 555b has the same (second) aspect ratio as the template structure 515b of FIG. 5b which is accordingly higher than the aspect ratio of the template structure 555a of FIG. 5c. The semiconductor structure 520b comprises a nanowire 522b of InAs which has been grown from a Si-seed 521b. The nanowire 522b has a length of more than 890 nm which has been grown in 850 s.

From the FIGS. 5a-5d it can be concluded that the growth rate (GR) increase is dominated by the template material, i.e., the presence of the TiN inner surface, and not by the cavity/template aspect ratio.

Further investigations of the embodiments of the present invention have e.g., shown that the growth rate increase due to a TiN surface area of the template structure is comparable to the influence of cavity crystal orientation, e.g., <110> vs. <111> direction.

Furthermore, the growth rate increase in a template structure with a TiN surface for V/III=150 (i.e., regime with small influence of template aspect ratio and crystal orientation on a growth rate in a pure dielectric template structure) is very similar to the V/III=70 case. Therefore, the growth rate increase only weakly depends on the V/III material ratio. This can be important for applications where growth uniformity is required, since the effective V/III ratio changes during semiconductor growth in the template.

Furthermore, the growth rate increase in template structures with an inner TiN surface can be particularly high (e.g., more than 4-fold) in the case of low material flow growth conditions. This can be used for applications and scalability since it provides an efficient incorporation of precursor material into the crystal, while parasitic nucleation and precursor consumption can be reduced.

In addition, in regimes where the growth rate of one facet significantly dominates over the other growth rates in pure dielectric cavities, the presence of a TiN as inner surface can significantly increase the growth rate of other facets. This can be used to tune the crystal geometry and it can enable growth of large crystals according to embodiments of the invention.

In general, the versatility of methods according to embodiments of the invention can allow any combination of group III-V semiconductor materials to grow in the template structure, including embedded quantum wells, quantum dots, quantum wires, doped or intrinsic semiconductor layers as well as heterojunctions.

According to embodiments the fabricated semiconductor structure can form a gain structure. Such a gain structure has been epitaxially grown and extends in a lateral direction of the substrate, more particularly in the x-y-plane. The x-y-plane is arranged in parallel to the underlying substrate.

Hence the embodied gain structure can include a doping profile which forms a p-i-n-structure. This can facilitate electrical pumping. A p-i-n-structure is a structure having an intrinsic region arranged between a p-doped region and a n-doped region.

In this respect, doping shall be understood as the intentional introduction of impurities into an intrinsic semiconductor for the purpose of modulating its electrical and optical and structural properties. Doping a semiconductor introduces allowed energy states within the band gap, but very close to the energy band that corresponds to the dopant type. Positive or p-type doping introduces free holes in the valence band, whereas negative or n-type doping introduces free electrons within the conduction band.

The introduction of dopants has the effect of shifting the energy bands relative to the Fermi level. In an n-type semiconductor the Fermi level is close to the conductance band, or within the conductance band in a degenerate n-type semiconductor. For p-type the Fermi level is close to the or within the Valance band. Doping densities in typically doped semiconductors range from $5 \times 10^{18}$ centimeter $(cm)^{-3}$ to $10^{20}$ $cm^{-3}$, depending on the material and density of states. Whereas semiconductors are rarely perfectly intrinsic, intrinsic in the electrical sense means that they are not conductive. Typically the doping level is around $10^{15}$-$10^{16}$ $cm^{-3}$.

While illustrative examples are given above, it will be appreciated that the basic fabrication steps described above can be used to produce semiconductor structures of other materials, shapes and sizes. Materials and processing techniques can be selected as appropriate for a given embodiment, and suitable choices will be readily apparent to those skilled in the art.

While particular examples have been described above, numerous other embodiments can be envisaged. The seed surfaces for growing the semiconductor structures can be crystalline seed surfaces, but can according to other embodiments also be provided by amorphous surfaces. If the seed has a well-defined crystalline orientation and if the crystal structure of the seed is a reasonable match to that of the growing crystal (for example a III-V compound semiconductor), the growing crystal can adapt this orientation. If the seed is amorphous or has an undefined crystal orientation, the growing crystal will be single crystalline but its crystal orientation will be random.

The disclosed semiconductor structures and circuits can be part of a semiconductor chip. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip can be integrated with other chips, discrete circuit elements, and/or other signal processing devices as part of either an intermediate product, such as a motherboard, or an end product. The end product can be any product that includes integrated circuit chips.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e., occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention, but encompass all possible aspects as described in the specification and the claims.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for fabricating a semiconductor structure comprising a semiconductor material, the method comprising:
    providing a template structure, the template structure comprising an opening, a cavity and a seed structure, the seed structure comprising a seed material and a seed surface, wherein a surface of the template structure comprises at least one metallic surface area comprising a metallic material, wherein the providing the template structure comprises:
        forming a first template layer on a sacrificial layer;
        patterning the sacrificial layer and the first template layer;
        forming a second template layer on the first template layer and a substrate;
        forming an opening in the second template layer; and
        selectively removing a part of seed material of the sacrificial layer, thereby forming the cavity; and
    growing the semiconductor structure within the cavity of the template structure from the seed surface along the metallic surface area.

2. The method of claim 1, wherein the metallic material and the semiconductor material are selected such that the metallic material does not provide a nucleation site for the semiconductor material.

3. The method of claim 1, wherein
    the metallic material has a melting point that is higher than a process temperature at which the step of growing the semiconductor structure is performed; and
    the metallic material is chemically stable at the process temperature.

4. The method of claim 1, wherein the metallic material is a transition metal nitride.

5. The method of claim 4, wherein the transition metal nitride is selected from the group consisting of: TiN; ZIN; HAN; VN; NbN; TaN; MON and WN.

6. The method of claim 1, wherein the semiconductor structure is grown in a lateral growth direction in parallel to a semiconductor substrate.

7. The method of claim 1, wherein the semiconductor structure is a nanowire.

8. The method of claim 1, wherein the providing the template structure comprises:
    forming a first template layer from a first template material; and
    forming a second template layer from a second template material, wherein the first template material is the metallic material.

9. The method of claim 8, wherein the second template material is a dielectric material.

10. The method of claim 8, further comprising selecting the metallic material, wherein the selecting the metallic material comprises:
    determining whether the metallic material comprises a surface energy lower than the surface energy of the seed surface or the surface energy of a front surface of the semiconductor structure during the step of growing, but higher than the surface energy of the second template material;
    determining whether the metallic material comprises a surface migration length higher than the surface migration length of the surface of the second template material; or
    determining whether the metallic material comprises a surface adsorption rate for the semiconductor material higher than the surface adsorption rate of the surface of the second template material.

11. The method of claim 8, wherein the providing the template structure comprises:
    providing a semiconductor substrate;
    forming a sacrificial layer on the semiconductor substrate, the sacrificial layer comprising the seed material;
    wherein the cavity comprises the seed structure with the seed surface.

12. The method of claim 1, further comprising forming the metallic material of the metallic surface area in a self-aligned manner with respect to the seed structure.

13. The method of claim 1, wherein the seed material is a group-IV material comprising Si, or a group III-V material selected from the group consisting of GaAs, InAs and InP.

14. The method as claimed in claim 1, wherein the semiconductor material is a group III-V semiconductor material comprising a group III element and a group V element.

15. The method of claim 14, wherein the step of growing the semiconductor structure is performed at a flow rate of less than 150 micromole (µmol)/minute (min) for the group V element and less than 2 µmol/min for the group III element.

16. The method of claim 1, wherein the growing of the semiconductor structure is performed by one of: metal organic chemical vapor deposition (MOCVD); atmospheric pressure CVD; low or reduced pressure CVD; ultra-high vacuum CVD; molecular beam epitaxy (MBE); atomic layer deposition (ALD) or hydride vapor phase epitaxy.

* * * * *